(12) United States Patent
Sanada et al.

(10) Patent No.: US 6,442,027 B2
(45) Date of Patent: Aug. 27, 2002

(54) ELECTRONIC CONTROL UNIT HAVING CONNECTOR POSITIONED BETWEEN TWO CIRCUIT SUBSTRATES

(75) Inventors: Kazuya Sanada, Kariya; Toshiaki Yagura, Nukata-gun, both of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/739,961

(22) Filed: Dec. 20, 2000

(30) Foreign Application Priority Data

Feb. 23, 2000 (JP) ........................................ 2000-045907
Mar. 15, 2000 (JP) ........................................ 2000-072356

(51) Int. Cl.[7] .................................................. H05K 7/20
(52) U.S. Cl. .................. 361/704; 361/715; 361/720; 361/721; 361/749; 439/76.1; 29/832
(58) Field of Search ................................ 361/687, 688, 361/683, 704, 707, 715–721, 749, 750, 784, 785, 789; 257/723, 724; 29/832, 840, 841, 856; 174/17.08; 165/104.33, 185

(56) References Cited

U.S. PATENT DOCUMENTS

| 4,689,721 A | * | 8/1987 | Damerow et al. | ........... 361/707 |
| 4,758,805 A | * | 7/1988 | Yamazaki et al. | ............. 333/12 |
| 4,811,165 A | * | 3/1989 | Currier et al. | ............... 361/716 |
| 4,858,071 A | * | 8/1989 | Manabe et al. | .............. 361/720 |
| 5,040,994 A | * | 8/1991 | Nakamoto et al. | ............. 439/76 |
| 5,103,375 A | * | 4/1992 | Cottingham et al. | ........ 361/715 |
| 5,362,243 A | * | 11/1994 | Huss et al. | .................... 439/76 |
| 5,408,383 A | | 4/1995 | Nagasaka et al. | |
| 5,519,252 A | | 5/1996 | Soyano et al. | |
| 5,605,477 A | * | 2/1997 | Wu et al. | ..................... 439/620 |
| 5,777,850 A | * | 7/1998 | Jacob et al. | ................. 361/736 |
| 5,959,839 A | * | 9/1999 | Gates | .......................... 361/704 |

FOREIGN PATENT DOCUMENTS

| JP | 1-147850 | 6/1989 |
| JP | 6-21330 | 1/1994 |

OTHER PUBLICATIONS

U.S. patent application Ser. No. 09/672,498, Murowaki, filed Sep. 29, 2000.

* cited by examiner

Primary Examiner—Boris Chervinsky
(74) Attorney, Agent, or Firm—Law Offices of David G. Posz

(57) ABSTRACT

The electronic control unit controls operation of actuators connected thereto based on sensor signals fed thereto and processed therein. The unit includes a control circuit substrate carrying control elements such as a microcomputer and a driving circuit substrate carrying driving elements such as power transistors. The driving circuit substrate handling power and the control circuit substrate handling only signals are separately positioned in a metal casing with a separating space therebetween to suppress heat transfer from the driving circuit substrate to the control circuit substrate. A connector electrically connecting the unit to outside sensors and actuators is positioned in the separating space to utilize the separating space also as a space for containing the connector.

11 Claims, 13 Drawing Sheets

ELECTRONIC CONTROL UNIT HAVING CONNECTOR POSITIONED BETWEEN TWO CIRCUIT SUBSTRATES

CROSS-REFERENCE TO RELATED APPLICATIONS

This application is based upon and claims benefit of priority of Japanese Patent Applications No. 2000-45907 filed on Feb. 23, 2000 and No. 2000-72356 filed or. Mar. 15, 2000, the contents of which are incorporated. herein by reference.

BACKGROUND OF THE INVENTION

1. Field of the Invention

The present invention relates to an electronic control unit for controlling operation of actuators and to a method of manufacturing the same.

2. Description of Related Art

Electronic control units for use in various controls, such as automotive engine control and transmission control, are generally known. The electronic control unit controls operation of actuators such as electromagnetic solenoids by supplying power thereto based on signals fed to and processed in the electronic control unit. Recent electronic controls for an automotive vehicle are becoming more sophisticated and multi-functional. Electric power to be controlled by driving elements in the electronic control unit is also becoming high. An amount of heat generated in the driving elements such as power transistors or power ICs contained in the electronic control unit becomes high. Such heat is transferred to control elements such as microcomputers contained in the same electronic control unit.

Figure 1:
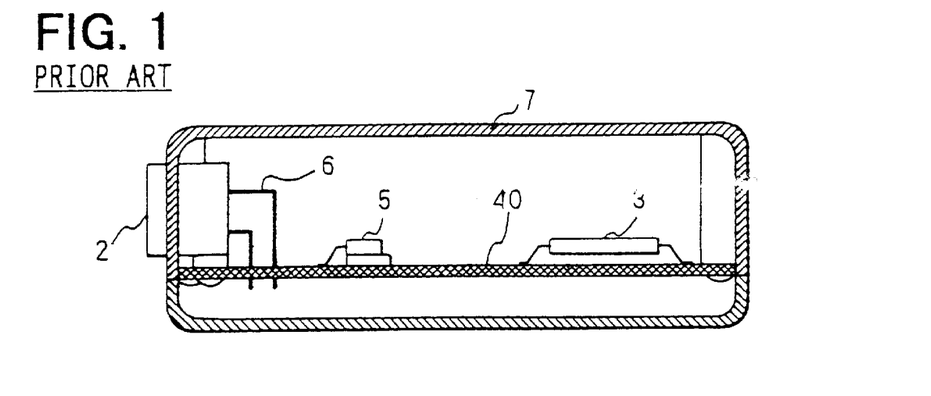
FIG. 1 is a cross-sectional view showing a conventional electronic control unit.

An example of conventional electronic control units is shown in FIG. 1. A circuit substrate 40 on which a driving element 5 and a control element 3 are mounted is contained in a casing 7. A connector 2 for electrically connecting the electronic control unit to outside sensors and actuators is also mounted in the casing. Heat generated in the driving element 5 such as a power transistor is transferred to the control element 3 such as a microcomputer, thereby heating the control element 3. If the control element 3 is excessively heated, its operation stability cannot be maintained. It could be possible to enlarge the circuit substrate 40 to suppress the heat transfer from the driving element 5 to the control element 3. However, it is not preferable, or may not be possible, to enlarge the size of the electronic control unit from viewpoints of a mounting space and a cost of the electronic control unit.

SUMMARY OF THE INVENTION

The present invention has been made in view of the above-mentioned problem, and an object of the present invention is to provide an improved electronic control unit, in which the heat transfer from the driving elements to the control elements is suppressed without enlarging the size of the electronic control unit.

The electronic control unit according to the present invention. 1 composed of a metal casing, a driving circuit substrate, a control circuit substrate, a flexible printed-circuit sheet connecting both substrates, and a connector for connecting the electronic control unit to outside actuators and sensors. The control circuit substrate includes control elements such as a microcomputer for processing signals fed from the outside sensors and for supplying control signals to the driving circuit substrate. The driving circuit substrate includes driving elements such as power transistors for supplying electric power to the outside actuators based on the control signals fed from the control circuit substrate.

The metal casing has a heat dissipation plate on which the driving circuit substrate generating a large amount of heat is mounted. The control circuit substrate that generates substantially no heat is contained in the casing apart from the driving circuit substrate. A separating space for suppressing heat transfer from the driving circuit substrate to the control circuit substrate is formed between both substrates. The connector is positioned in the separating space. Thus, the separating space in the casing is also utilized as a space for containing the connector. Both substrates are electrically connected by a flexible printed-circuit-sheet which absorbs vibration energy to protect electrical connections. The flexible printed-circuit-sheet is connected to the control circuit substrate at a vicinity of connector pins connecting the connector to the control circuit substrate to reduce electrical resistance in the circuit.

The connector may be mounted on the control circuit substrate and electrically connected thereto. In this case, preferably, both substrates are first connected by the flexible printed-circuit-sheet, and then the connector is mounted on the control circuit substrate to simplify the manufacturing process.

Alternatively, the connector may be mounted on the casing and electrically connected to the flexible printed-circuit-sheet. In this case, preferably, the connector is electrically connected to the flexible printed-circuit-sheet, and then the flexible sheet is electrically connected to both substrates. After that, the connector is mounted on the casing. Elements for absorbing noise coming into the electronic control unit may be surface-mounted on the flexible sheet. Components having inserting leads may also be mounted on the flexible sheet, removing such components from the control circuit board. If no such component is mounted on the control circuit substrate, electrical connections on the control circuit substrate can be carried out only by reflow-soldering. Further, a portion of the flexible sheet on which electric components are mounted may be made of a hard printed-board to secure stable electrical connections against vibration. Components mounted on the flexible sheet may be supported by a holder formed integrally with the connector to secure a higher mechanical strength.

According to the present invention, the driving circuit substrate and the control circuit substrate are positioned in the casing with a separating space therebetween, and the connector is disposed within the separating space. In other words, the separating space for suppressing the heat transfer is also utilized as a space for containing the connector therein. Accordingly, the heat transfer is effectively suppressed without enlarging the size of the electronic control unit.

Other objects and features of the present invention will become more readily apparent from a better understanding of the preferred embodiments described below with reference to the following drawings.

DETAILED DESCRIPTION OF THE PREFERRED EMBODIMENTS

Figure 2A:
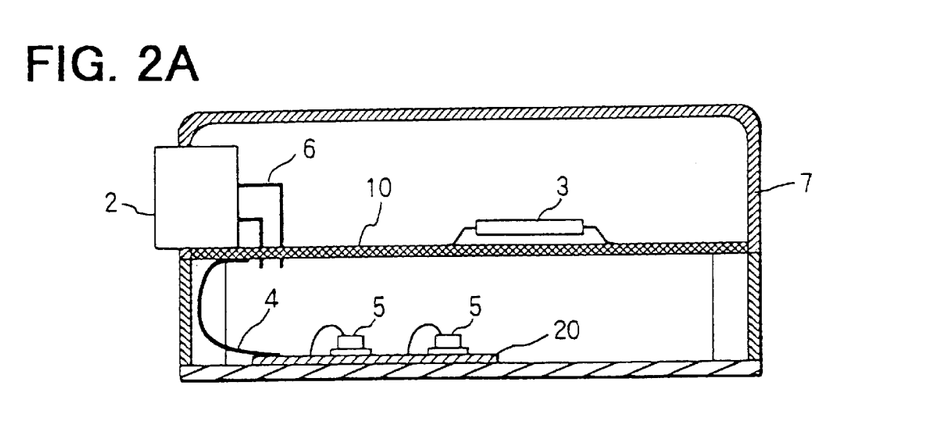
FIG. 2A is a cross-sectional view showing an electronic control unit as a comparative example to embodiments of the present invention.
Figure 2B:
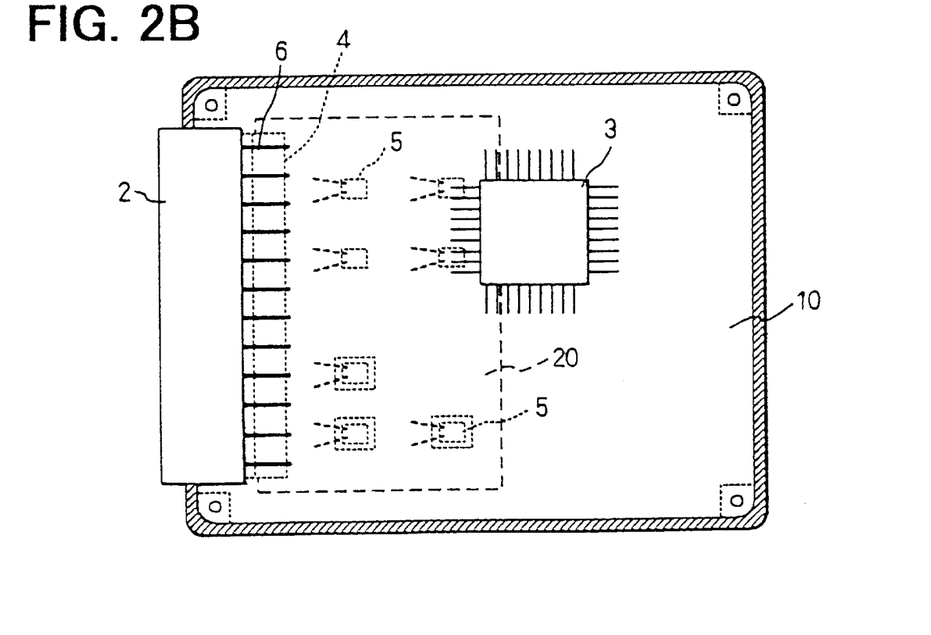
FIG. 2B is a plan view of the electronic control unit shown in FIG. 2A with its upper case removed.

One solution for suppressing heat transfer from driving elements to control elements contained in the same casing is to divide the circuit substrate 40 shown in FIG. 1 into a substrate carrying only the control elements thereon and another substrate carrying the driving elements thereon. One example of such arrangements is shown in FIGS. 2A and 2B. FIG. 2A is a cross-sectional view and FIG. 2B is a plan view with an upper case removed. A control circuit substrate 10 carrying the control element 3 is supported in the middle portion of the casing 7, while a driving circuit substrate 20 carrying the driving elements 5 is mounted on bottom heat dissipation plate of the casing 7. Both substrates are electrically connected by a flexible printed-circuit-sheet 4. A connector 2 for electrically connecting the electronic control unit to outside sensors and actuators is mounted on and electrically connected to the control circuit substrate 10.

Since the driving circuit substrate 20 is positioned apart from the control circuit substrate 10 with a certain space therebetween, the heat transfer from the substrate 20 to the substrate 10 can be suppressed. If it is possible to make the space between two substrates 10, 20 sufficiently large, the heat transfer would be sufficiently suppressed. However, it is desirable to make this space smaller to make an entire control unit size smaller. The height of the upper half space in the casing 7 cannot be shortened because there is positioned the connector 2.

Figure 3A:
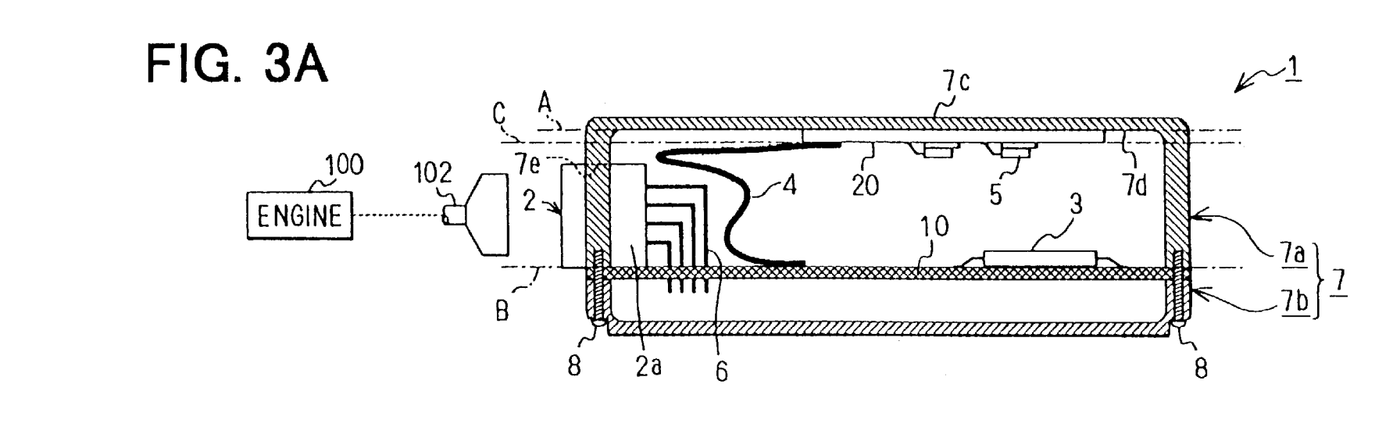
FIG. 3A is a cross-sectional view showing an electronic control unit as a first embodiment of the present invention.

A first embodiment of the present invention shown in FIG. 3A is designed to further improve the example shown in FIGS. 2A and 2B. The first embodiment of the present invention will be described in detail with reference to FIGS. 3A–3C.

First, referring to FIG. 3A, the structure of an electronic control unit 1 will be described. The electronic control unit 1 is used for controlling operation of various actuators of an automotive engine 100, such as ignition plugs and electromagnetic solenoids. The electronic control unit 1 is electrically connected to the actuators and sensors through a. cable 102. The electronic control unit 1 is composed of a casing 7, a control circuit substrate 10 carrying control elements 3 thereon, a driving circuit substrate 20 carrying driving elements 5 thereon, and a connector 2 coupled to the cable 102. Both substrates 10 and are electrically connected through a flexible printed-circuit-sheet 4.

The casing 7 is composed of an upper case 7a and a lower case 7b, and both cases 7a, 7b are connected by screws 8. The control circuit substrate 10 is mounted in the casing 7, being inserted between the upper case 7a and the lower case 7b. The driving circuit substrate 20 is mounted on an inner wall 7d of an upper wall 7c of the casing 7. The connector 2 is inserted through a side opening 7e of the upper case 7a so that its portion 2a is positioned inside the casing 7, and is mounted on the substrate 10. The connector 2 is positioned in a space between a surface A (the inner surface 7d of the upper wall 7c) and a surface B (the upper surface of the substrate 10), preferably in the space between a surface C (the lower surface of the substrate 20) and the surface B. A plurality of connector pins 6 extending from the connector 2 are inserted into the control circuit substrate 10 and electrically connected thereto.

The control elements 3 consist of an one-chip microcomputer to which signals from various sensors are fed. The signals fed to the microcomputer are processed to form control signals to be supplied to the driving elements 5. The control elements 3 also perform communication with various electronic components mounted on the automobile through the cable 102. The control circuit substrate 10 on which the control elements 3 are mounted is made of a resin board such as an epoxy-impregnated glass-cloth, and control circuits are formed thereon. Electronic components (not shown) other than the control elements 3 are also mounted on both sides of the control circuit substrate 10.

The connector 2 is mounted on the control circuit substrate 10, and the connector pins 6 are electrically connected to the control circuit substrate 10. As shown in FIG. 3A, the connector pins 6 are connected to the control circuit substrate 10 at its left side end, and one end of the flexible printed-circuit sheet 4 is electrically connected to the control circuit substrate 10 by soldering at a vicinity of the position where the connector pins 6 are connected. The other end of the flexible printed-circuit sheet 4 is electrically connected to the driving circuit substrate 20. The flexible printed-circuit sheet 4 is bent and connected to both substrates 10, 20 with a proper allowance as shown in FIG. 3A, so that it absorbs vibration transferred from the engine and does not contacts the upper wall 7c.

The driving elements 5 mounted on the driving circuit substrate 20 are so-called switching elements for supplying electric power to the outside actuators. The electric power is supplied from an on-board battery (not shown) through the driving elements based on the control signals fed from the control elements 3. The driving circuit substrate 20 is made of a heat-conductive ceramic plate on which driving circuits are formed. Components (not shown) other than the driving elements 5 are also mounted on the driving circuit substrate 20. The driving circuit substrate 20 is mounted on the inner surface 7d of the upper wall 7c in close contact therewith, so that heat generated in the driving elements 5 is easily transferred to the casing 7 and dissipated therefrom. The casing 7 is made of a metallic material such as cast aluminum, and its upper wall 7c serves as a heat-dissipation plate.

A process of assembling the electronic control unit 1 will be described with reference to FIGS. 3B and 3C. The driving elements 5 and other components are mounted on and connected to the driving circuit substrate 20. The driving circuit substrate 20 is bonded on the inner surface 7d of the upper wall 7c with a heat-conductive adhesive which is cured by applying heat (e.g., 150° C.) for a certain time (e.g., 30 minutes). Heat resistance between the upper wall 7c and the driving circuit substrate 20 is made as small as possible. On the other hand, the control elements 3 and other components are mounted on and connected to the control circuit substrate 10. The connector 2 is also mounted on and connected to the control circuit substrate 10.

Figure 3B:
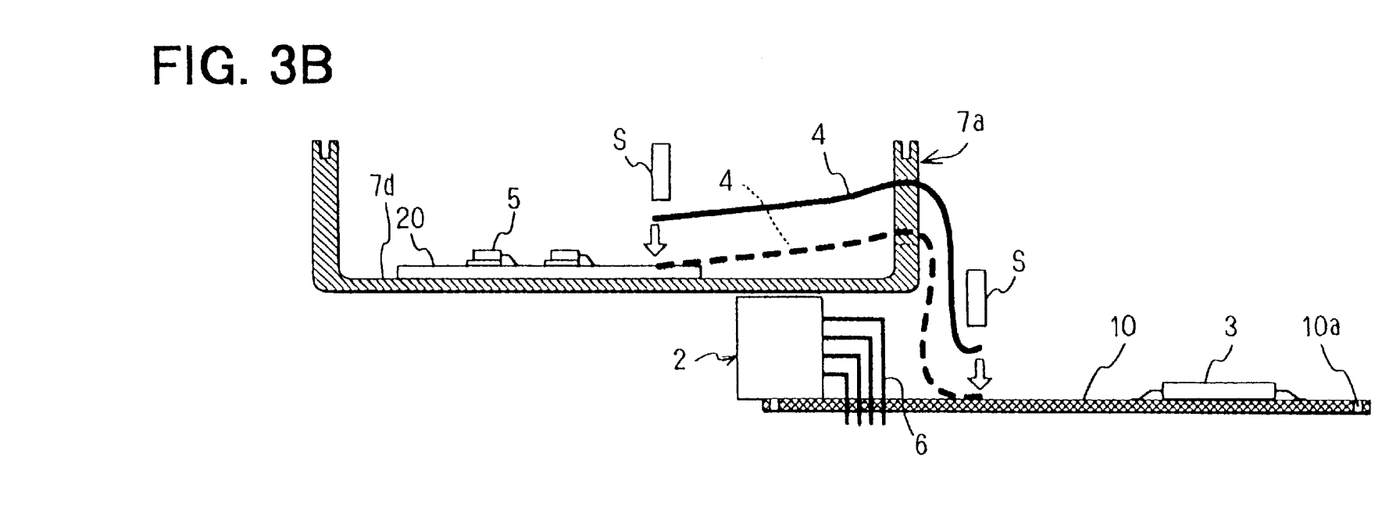
FIG. 3B is a cross-sectional view showing one stage of assembling the electronic control unit shown in FIG. 3A.
Figure 3C:
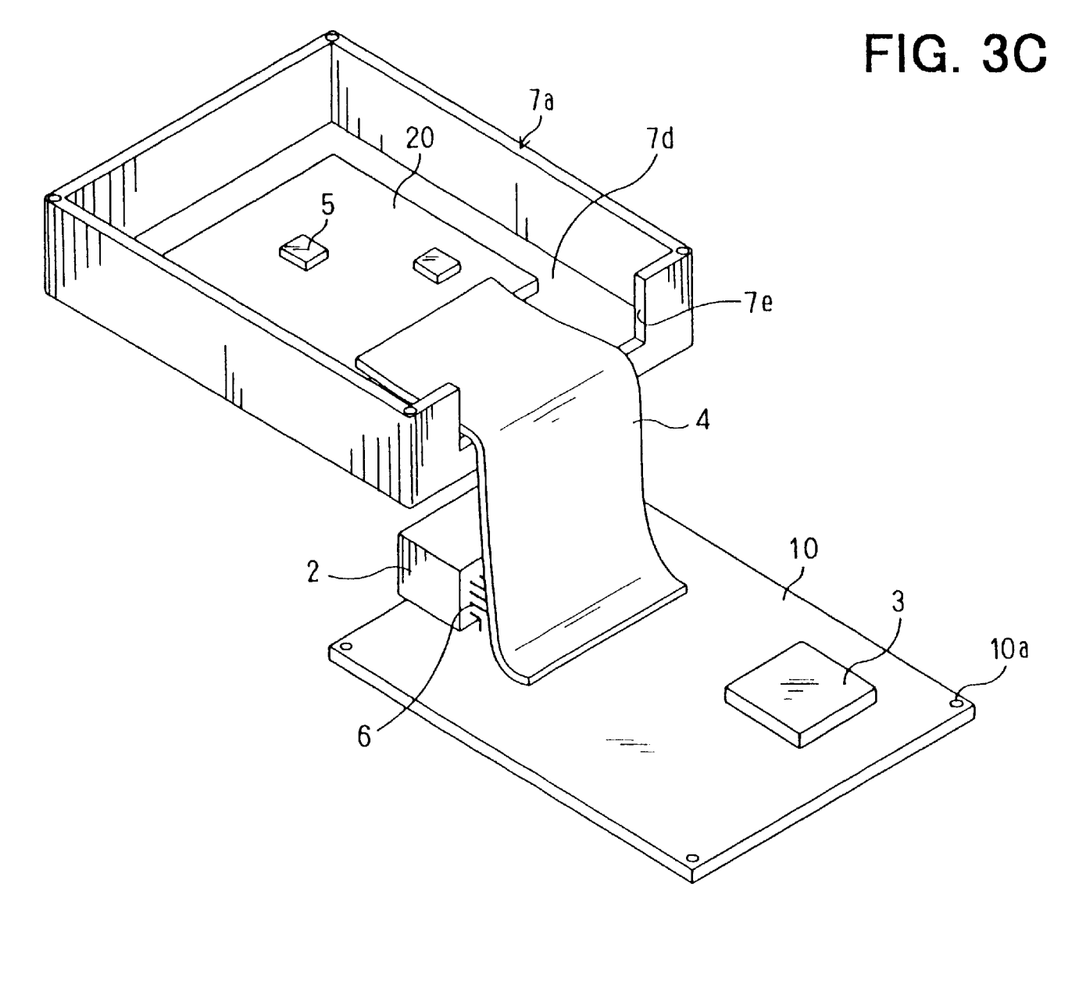
FIG. 3C is a perspective view showing the same assembling stage as shown in FIG. 3B.

Then, the upper case 7a carrying the driving circuit substrate 20 thereon and the control substrate 10 are positioned as shown in FIG. 3B. The flexible printed-circuit-sheet 4 is placed over the both substrates 10, 20 through the side opening 7e of the upper case 7a. Both ends of the flexible printed-circuit-sheet 4 are pressed down on the terminal portions of both circuit substrates 10, 20 by jigs S. The flexible printed-circuit-sheets 4 is soldered to both substrates 10, 20, at their terminal portions under heat and pressure. More particularly, solder is attached to the terminal portions of both substrates 10, 20, and then both ends of the flexible printed-circuit-sheet 4 are pressed down on the solder by heated jigs S. Since the connector 2 mounted on the control circuit substrate 10 prevents the flexible printed-circuit-sheet 4 from being extended flat, the upper case 7a and the control circuit substrate 10 are positioned as shown in FIGS. 3B and 3C (FIG. 3C is a perspective view of FIG. 3B).

After the flexible printed-circuit-sheet 4 is soldered, the upper case 7a is flipped over the control circuit substrate 10 so that the inner surface 7d of the upper case 7a faces the control circuit substrate 10. Then, the control circuit substrate 10 is sandwiched between the upper case 7a and the lower case 7b, as shown in FIG. 3A. Screws 8 are inserted into through-holes 10a formed on the control circuit substrate 10 and tightly fastened thereby to form a unitary casing 7.

The electronic control unit 1 as the first embodiment of the present invention has the following advantages. Since the connector 2 is positioned in the space between the driving circuit substrate 20 and the control circuit substrate 10, the control substrate 10 can be placed sufficiently apart from the driving circuit 20 thereby to suppress heat transfer from the driving circuit substrate 20 to the control circuit substrate 10. In other words, the space for containing the connector 2 in the casing 7, is also utilized as the space for separating both substrates 10, 20 from each other. Thus, the harmful heat transfer is effectively suppressed without enlarging an entire size of the electronic control unit 1.

Since both substrates 10, 20 are electrically connected by the flexible printed-circuit-sheet 4, the electrical connection is stably secured against vibration transferred to the casing 7. Vibration caused by engine operation, for example, does not directly affect the electrical connection because it is absorbed by the flexibility of the flexible printed-circuit-sheet 4. Since the soldering of the flexible printed-circuit-sheet 4 to both substrates 10, 20 can be carried out at the same time, the manufacturing process of the electronic control unit 1 is simplified.

Further, since the flexible printed-circuit-sheet 4 is soldered to the control circuit substrate 10 at a vicinity of the connector pins 6, the soldering terminal portions of the control circuit substrate 10 can be simplified. At the same time, electrical resistance between the connector pins 6 and the circuit pattern can be reduced.

Figure 4A:
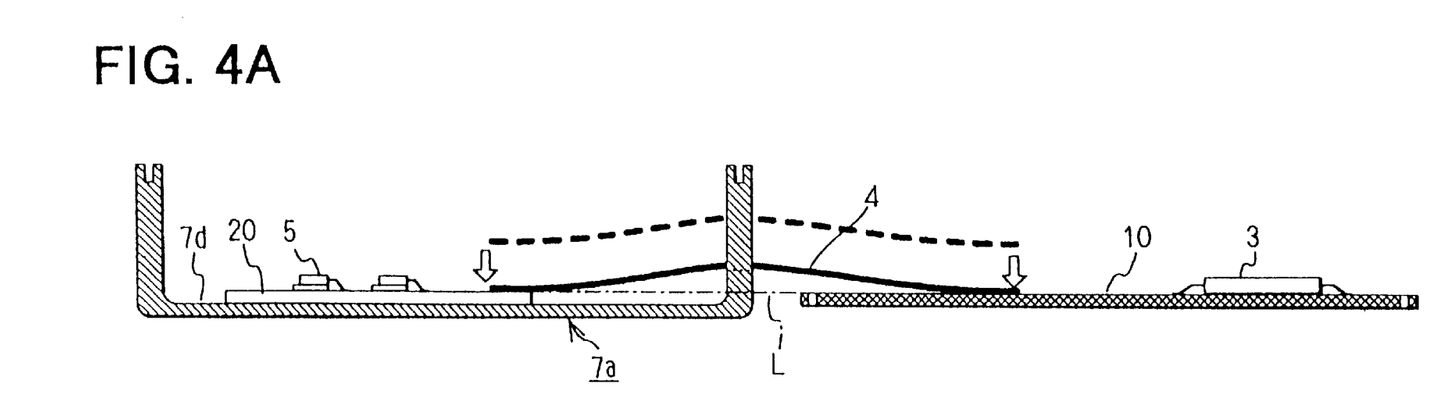
FIG. 4A is a cross-sectional view showing one stage of assembling an electronic control unit as a second embodiment of the present invention.

A second embodiment of the present invention will be described with reference to FIGS. 4A–4C. The structure of the second embodiment is the same as that of the first embodiment. However, the assembling process is partly different. That is, the connector 2 is not yet mounted on the control circuit substrate 10 when the flexible printed-circuit-sheet 4 is soldered to both substrates 10, 20. As shown in FIGS. 4A and 4C (FIG. 4C is a perspective view of FIG. 4A), the upper case 7a having the driving circuit substrate 20 mounted thereon and the control circuit substrate 10 are placed at a same level L. The flexible printed-circuit-sheet 4 is extended flat over both substrates 10, 20, and then it is soldered under heat and pressure in the same manner as in the first embodiment.

Figure 4B:
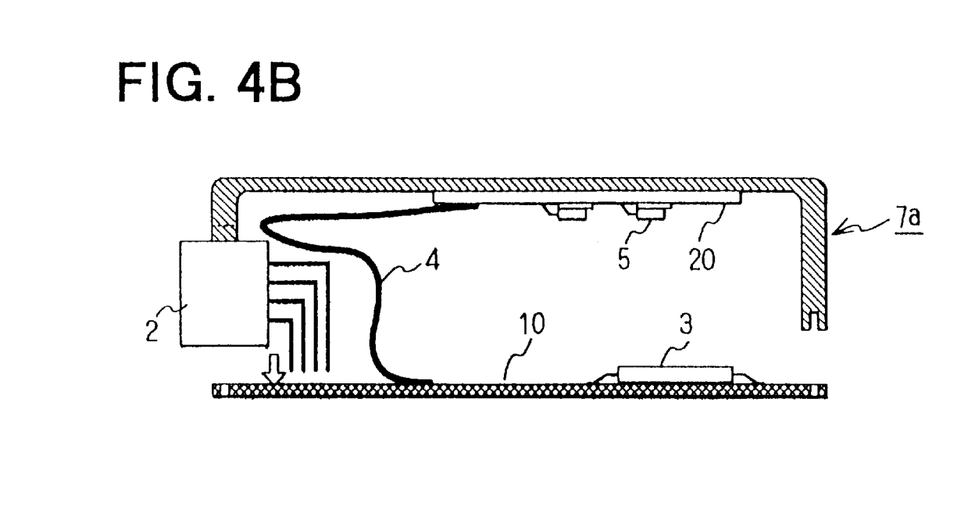
FIG. 4B is a cross-sectional view showing the next assembling stage following the stage shown in FIG. 4A.
Figure 4C:
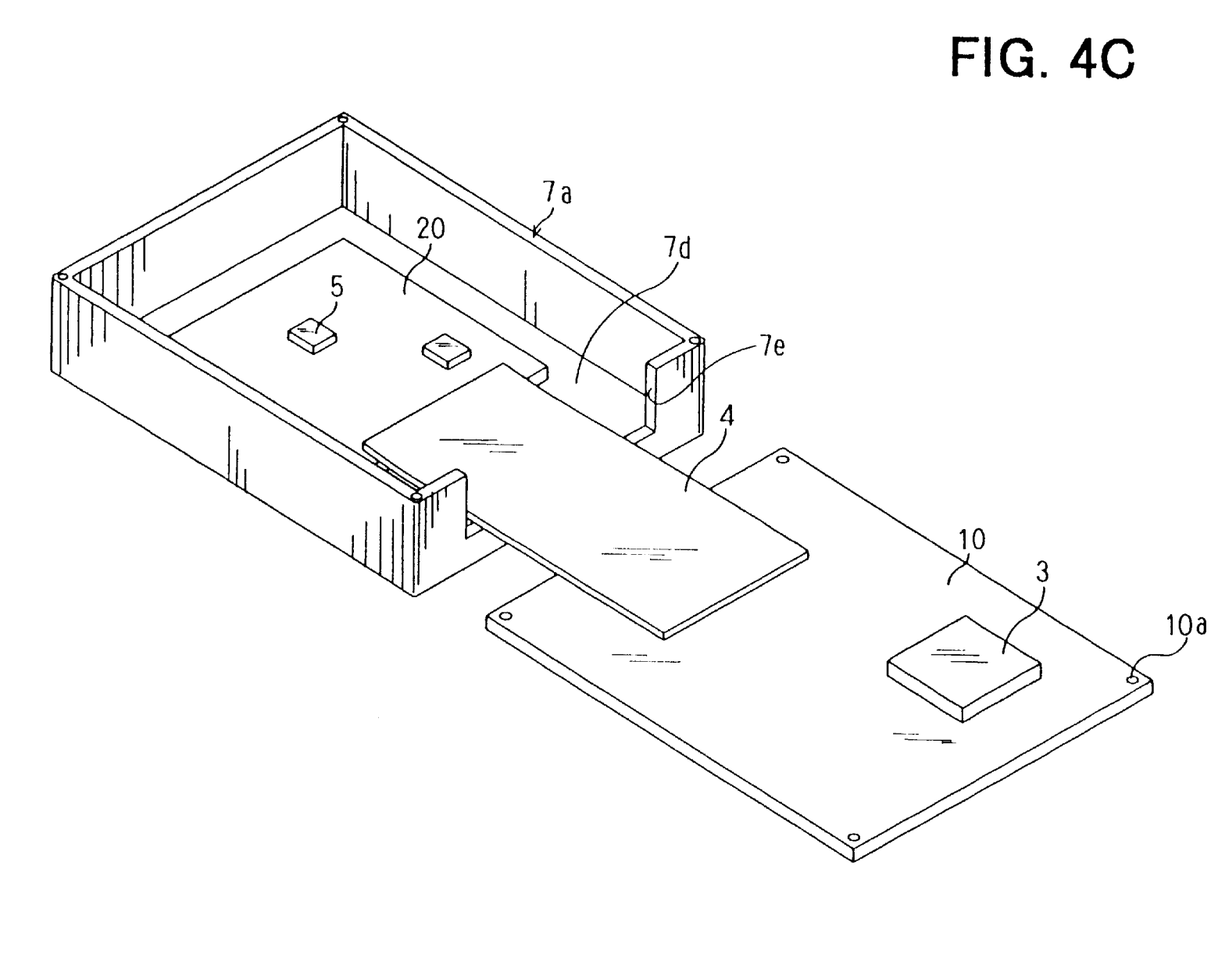
FIG. 4C is a perspective view showing the same assembling stage as shown in FIG. 4A.

Then, the upper case 7a is flipped over the control circuit substrate 10 a s shown in FIG. 4B. Then, the connector 2 is inserted through the side opening 7e of the upper case 7a and mounted on and connected to the control circuit substrate 10. The flexible printed-circuit-sheet 4 is bent not to contact the connector 2 when the connector 2 is positioned below the flexible sheet 4. Then, the lower case 7b is fastened to the upper case 7a, sandwiching the control circuit substrate 10, in the same manner as in the first embodiment.

Since, in the second embodiment, the connector 2 is not on the way of the flexible sheet 4 in the soldering process, the flexible sheet 4 can be extended flat over both substrates 10, 20. Both substrates 10, 20 can be positioned at the same level L to solder the flexible sheet 4, and therefore, the soldering can be performed easier.

A third embodiment of the present invention will be described with reference to FIGS. 5A–5D. An electronic control unit 51 as the third embodiment is similar to the first embodiment, except that the connector 2 is replaced with a connector 32 which is mounted on the flexible printed-circuit-sheet 4, and that the control circuit substrate 10 is replaced with a control circuit substrate 30 having a somewhat different shape.

Figures 5A, 5B, 5C:
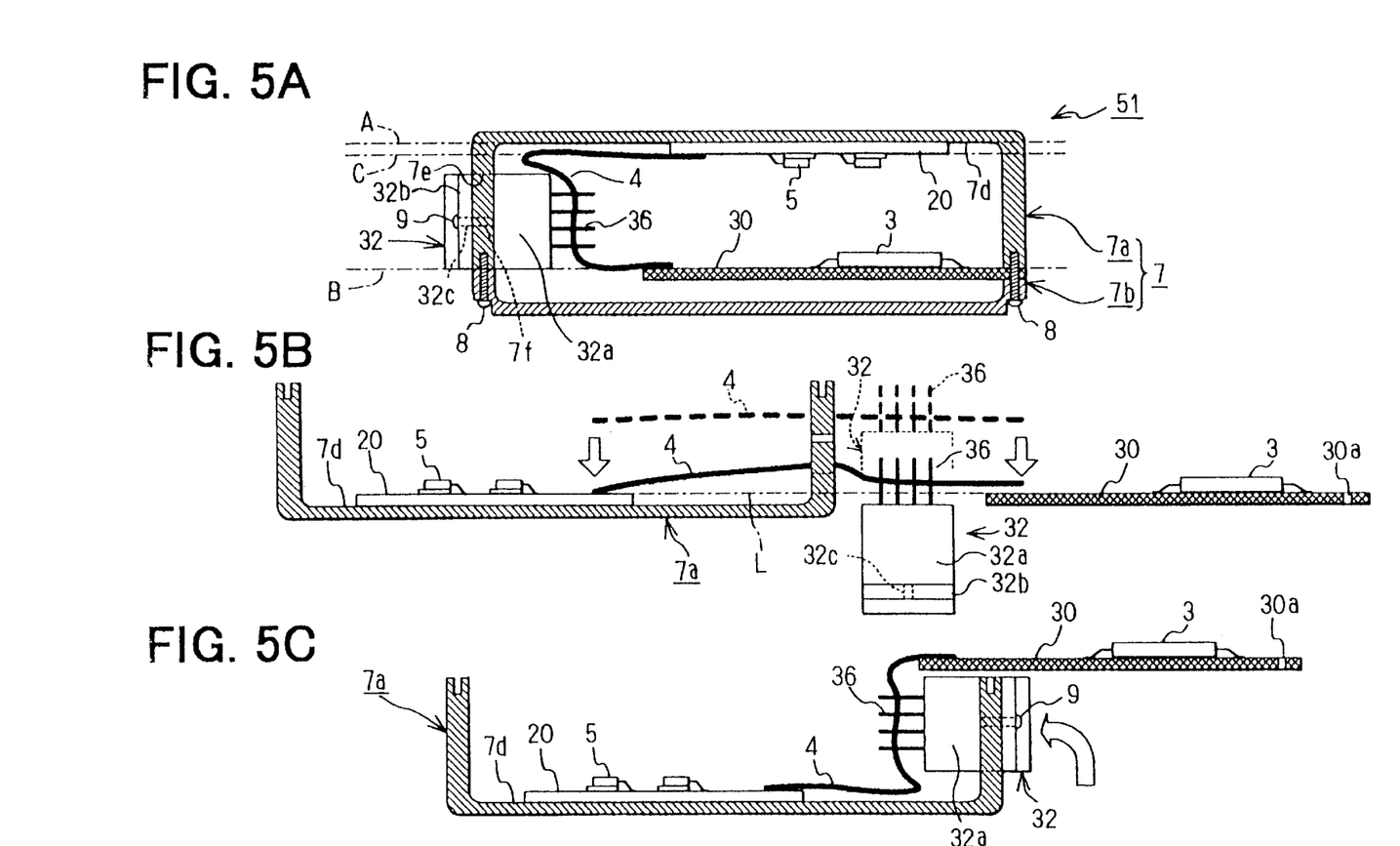
FIG. 5A is a cross-sectional view showing an electronic control unit as a third embodiment of the present invention.
FIG. 5B is a cross-sectional view showing one stage of assembling the electronic control unit shown in FIG. 5A.
FIG. 5C is a cross-sectional view showing the next assembling stage following the stage shown in FIG. 5B.

As shown in FIG. 5A, the connector 32 includes a flange 32b having a hole 32c. A screw hole 7f is formed through the side wall of the upper case 7a, and the connector 32 is fixed to the side wall by a screw 9. The connector 32 is inserted into the casing 7 through the side opening 7e so that it is positioned between the surfaces A and B, preferably between the surfaces C and B. A portion 32a of the connector 32 is positioned inside the casing 7. Connector pins 36 are inserted into a middle portion of the flexible printed-circuit-sheet 4 and electrically connected there. One end of the flexible sheet 4 is electrically connected to the driving circuit substrate 20, while the other end is electrically connected to an end portion of the control circuit substrate 30. Structures other than the above are the same as those of the first embodiment.

Figure 5D:
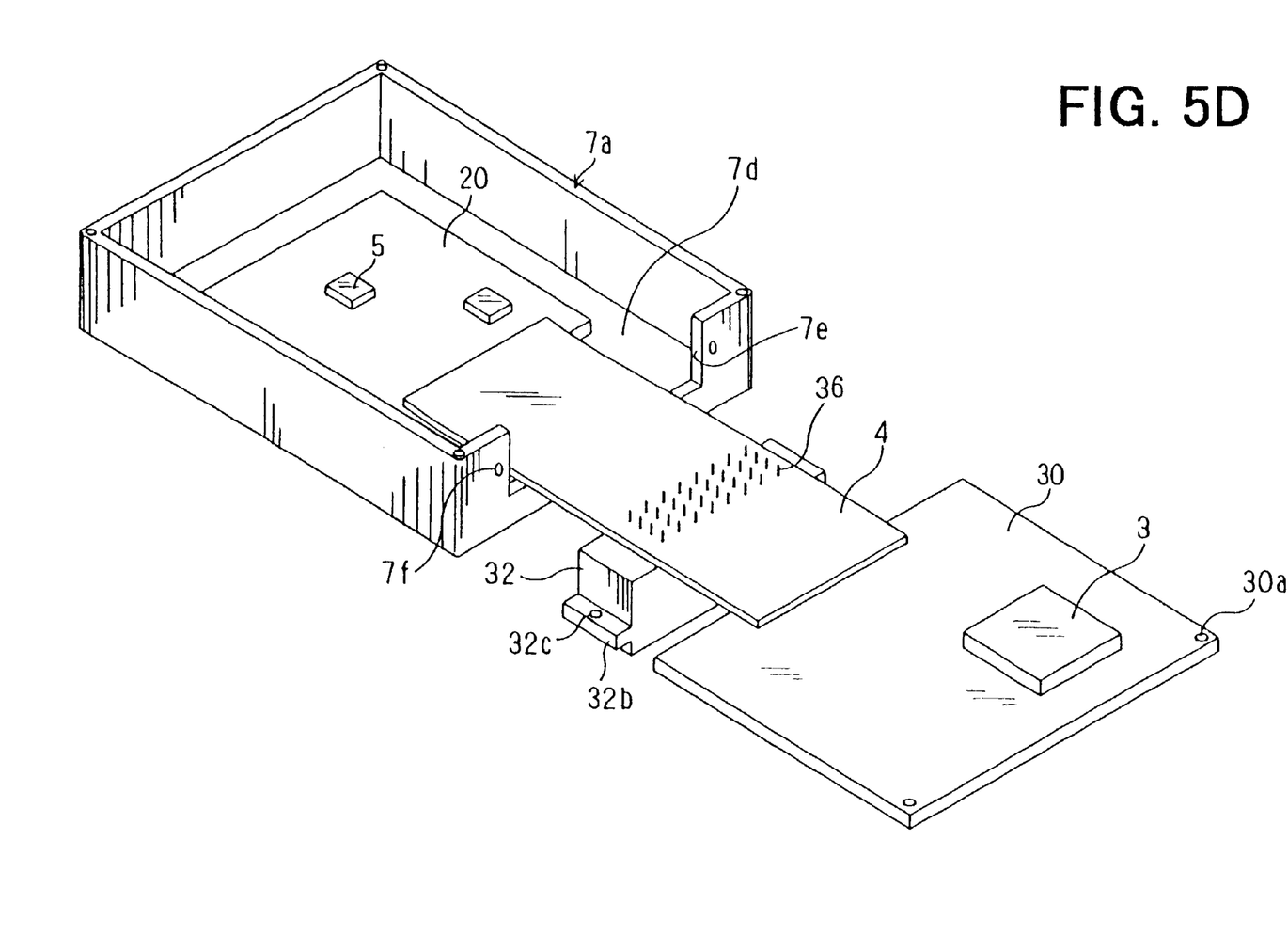
FIG. 5D is a perspective view showing the same assembling stage as shown in FIG. 5B.

Referring to FIGS. 5B–5D, a process of assembling the electronic control unit 51 will be described. First, the driving circuit substrate 20 and the control circuit substrate 30 are prepared in the same manner as in the foregoing embodiments, but the connector 32 is not mounted on the control circuit substrate 30. Instead, the connector 32 is electrically connected to the flexible printed-circuit-sheet 4 at a middle portion thereof. The driving circuit substrate 20 is mounted on the inner surface 7d of the upper case 7a.

Then, as shown in FIG. 5B, the upper case 7a and the control circuit substrate 30 are positioned in the same horizontal level L. Then, the flexible sheet 4 carrying the connector 32 thereon is placed over both substrates 20, 30, and soldered on the terminal portions of both substrates 20, 30 under heat and pressure. Since the connector 32 is not an obstacle to stretch the flexible sheet 4 over both substrates 20, 30, the soldering process is easily carried out by placing both substrates 20, 30 at an even level. FIG. 5D is a perspective view showing the same stage as shown in FIG. 5B.

Then, as shown in FIG. 5C, the connector 32 is mounted on and fixed to the sidewall of the upper case 7a with the screw 9. Then, the upper case 7a is flipped over the control circuit substrate 30, so that the control circuit substrate 30 is positioned underneath the upper case 7a as shown in FIG. 5A. Then, the lower case 7b is fixed to the upper case 7a with screws 8 inserted into the through hole 30a formed on the control circuit substrate 30. The control circuit substrate 30 is sandwiched between the upper case 7a and the lower case 7b. Thus, the electronic control unit 51 is completed.

Since, in this third embodiment, the connector 32 is not mounted on the control circuit substrate 30 but is mounted on the sidewall of the upper case 7a and electrically connected to the middle portion of the flexible sheet 4, the height of the casing 7 can be made further smaller than that of the first embodiment. The inner space of the casing 7 where the connector 32 is located is utilized as the space separating both substrates 10, 30 in the sa me manner as in the first embodiment, the heat transfer from the driving circuit substrate 20 to the control circuit substrate 30 is effectively suppressed without enlarging the size of the casing 7. Since the connector 32 is electrically connected to the middle portion of the flexible sheet 4, it is not necessary to form driving current paths on the control circuit substrate 30. In addition, the driving current paths from the driving circuit substrate 20 to the connector 32 are shorter than those in the first embodiment. Therefore, heat generated in the driving current paths is further suppressed.

With reference to FIGS. 6A–6D, a fourth embodiment of the present invention will be described. The electronic control unit 51 as the fourth embodiment is similar to the third embodiment, except that noise-absorbing elements 13 are additionally mounted on the flexible printed-circuit-sheet 4, and that an element 14 having inserting leads 14a is additionally mounted on the control circuit substrate 30.

Figure 6A:
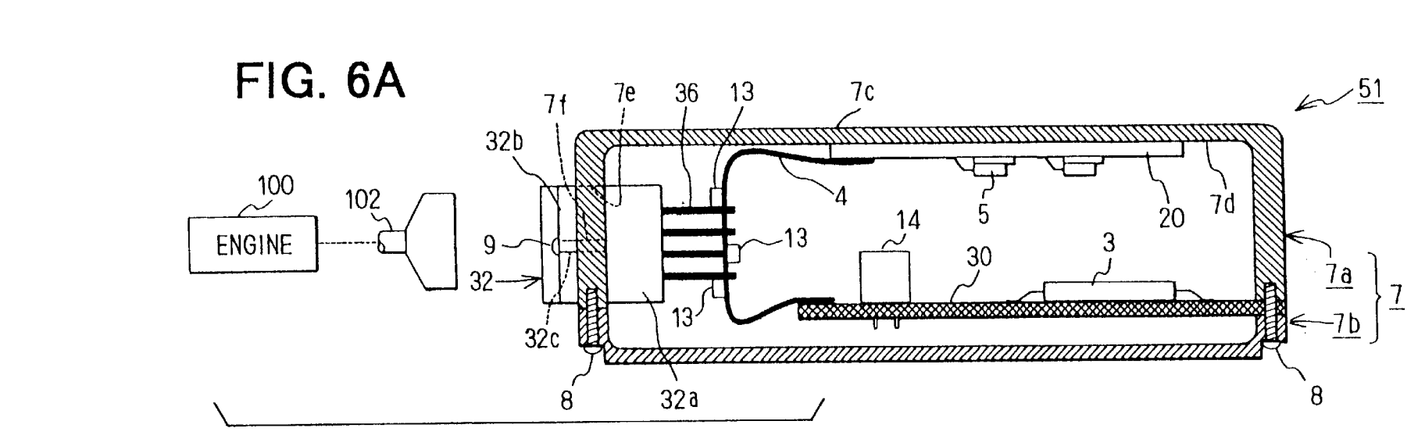
FIG. 6A is a cross-sectional view showing an electronic control unit as a fourth embodiment of the present invention.

To suppress or absorb noises entering into the electronic control unit 51 through the cable 102 and the connectors 32, it is often required to dispose noise-absorbing elements both on the driving circuit substrate 20 and on the control circuit substrate 30. The noise-absorbing elements have to be properly selected according to situations where the electronic control unit is used. If such noise absorbing elements are mounted on the substrates 20, 30, both substrates cannot be standardized because the noise-absorbing elements have to be changed according to the situations. Therefore, in this fourth embodiment, such noise-absorbing elements 13 are mounted on the flexible sheet 4, thereby to simplify and standardize both substrates 20, 30 and to reduce the manufacturing cost of the electronic control unit 51.

Figure 6B:
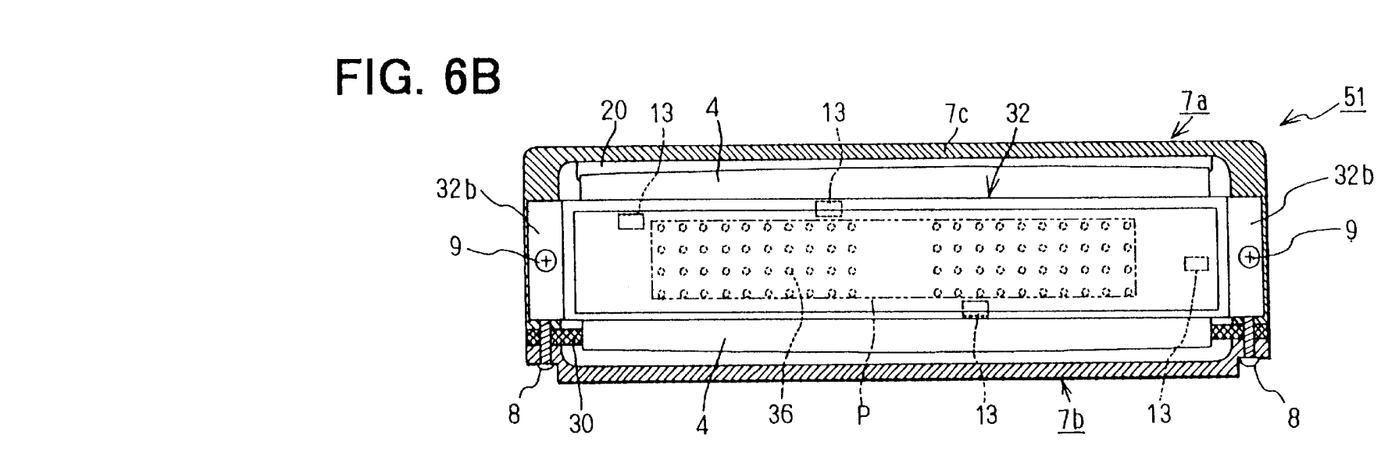
FIG. 6B is a cross-sectional view showing the electronic control unit shown in FIG. 6A, viewed from a connector side.

First, referring to FIG. 6A showing a cross-sectional view of the electronic control unit 51 and FIG. 6B showing the same viewed from the side where the connector 32 is mounted, the fourth embodiment will be described. Since the most structures are the same as those of the third embodiment, only the structure peculiar to this embodiment will be described below.

The flexible printed-circuit-sheet 4 is composed of a mounting portion on which the connector pins 36 and the noise-absorbing elements 13 and connecting portions formed at both sides of the mounting portion. The connecting portions are electrically connected to both substrates 20, 30, respectively, in the same manner as in the third embodiment. As shown in FIG. 6B, the mounting portion includes an area P where the connector pins 36 are inserted and an outer area where the noise-absorbing elements 13 are surface-mounted (mounted on the surface without inserting leads). The element 14 having inserting leads is mounted on and connected to the control circuit substrate 30 by inserting its leads.

A process of assembling the electronic control unit 51 will be briefly described with reference to FIGS. 6C and 6D. The driving circuit substrate 20 is mounted on the inner surface 7d of the upper case 7a in the same manner as in the foregoing embodiments. The control elements 3 are surface-mounted on the control circuit substrate 30, and the element 14 is also mounted on the same substrate 30 by inserting its leads 14a. The connector pins 36 are inserted into and soldered on the mounting portion of the flexible sheet 4, and the noise-absorbing elements 13 are surface-mounted thereon.

Figure 6C:
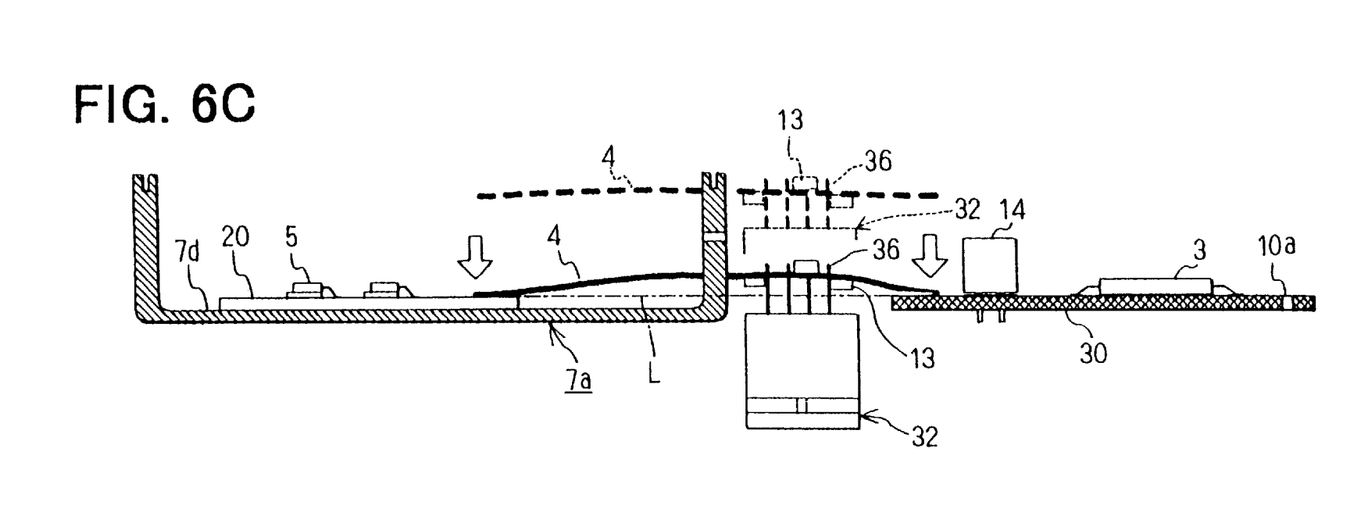
FIG. 6C is a cross-sectional view showing one stage of assembling the electronic control unit shown in FIG. 6A.
Figure 6D:
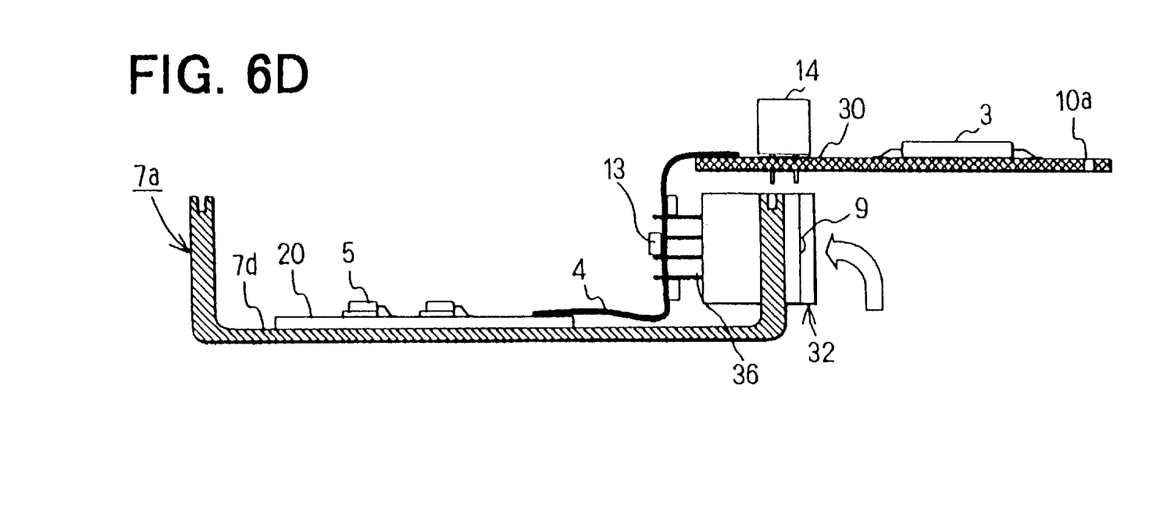
FIG. 6D is a cross-sectional view showing the next assembling stage following the stage shown in FIG. 6C.

Then, as shown in FIG. 6C, the upper case 7a having the driving circuit substrate 20 thereon and the control circuit substrate 30 having components mounted thereon are positioned. at an even level L. The flexible printed-circuit-sheet 4 having the connector 32 and the noise-absorbing elements connected thereto is placed over both substrates 20, 30. The flexible sheet 4 is electrically connected to the terminal portions of both substrates 20, 30 under heat and pressure in the same manner as in the foregoing embodiments. Then, as shown in FIG. 6D, the connector 32 is turned by 90 degrees and mechanically fixed to the side wall of the upper case 7a with screws 9. Then, the upper case 7a is flipped over the control circuit substrate 30 to place the substrate 30 underneath the upper case 7a. Then, the upper case 7a and the lower case 7b are mechanically connected by screws 8, sandwiching the control circuit substrate 30 between the upper case 7a and the lower case 7b. Thus, the electronic control unit 51 is completed.

The same advantages as those of the third embodiment are obtained in this embodiment, too. In addition, since the noise-absorbing elements 13 are mounted on the flexible printed-circuit-sheet 4, noises entering into the electronic control unit 51 are absorbed by those elements without mounting respective noise-absorbing elements on both substrates 20, 30. Further, since the connector pins 36 are connected to the flexible sheet 4 in the area P while the noise-absorbing elements 13 are mounted on the area outside the area P, the process of mounting those components on the flexible sheets is easily carried out.

Figure 7A:
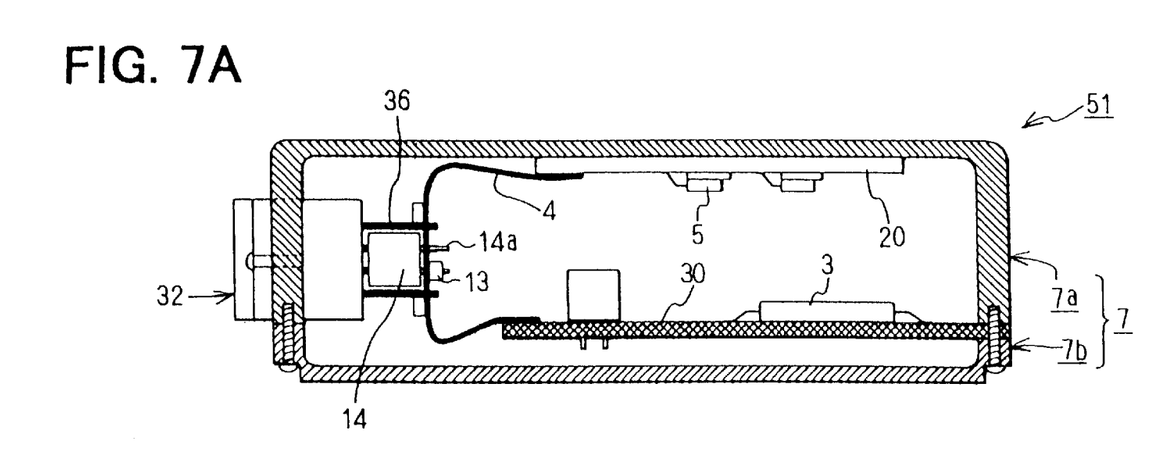
FIG. 7A is a cross-sectional view showing an electronic control unit as a fifth embodiment of the present invention.
Figure 7B:
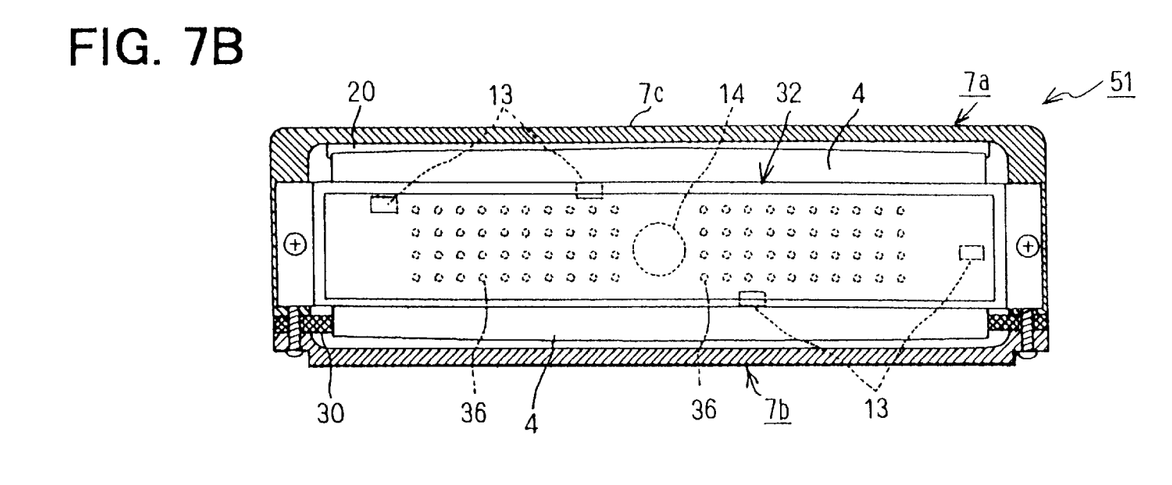
FIG. 7B is a cross-sectional view showing the electronic control unit shown in FIG. 7A, viewed from a connector side.

Referring to FIGS. 7A and 7B, a fifth embodiment of the present invention will be described. This embodiment is almost the same as the fourth embodiment, except that the element 14 having inserting leads 14a is mounted on and connected to the flexible printed-circuit-sheet 4. In other words, the element 14 mounted on the control circuit substrate 30 in the fourth embodiment is moved to the flexible sheet 4.

As shown in FIG. 7B, the element 14 having inserting leads 14a is positioned at the center of the mounting area of the flexible sheet 4 where the connector pins 36 are connected. The inserting leads 14a are inserted into the flexible sheet 4 in the same direction as the connector pins 36 are inserted. Accordingly, the connector pins 36 and the element 14 can be soldered at the same time by flow-soldering. The control circuit substrate 30 in this embodiment only carries surface-mounting elements including the control element 3. Therefore, those surface-mounting elements can be soldered only by reflow-soldering. If lead-inserting elements were also included on the same substrate, flow-soldering would be required in addition to the reflow-soldering.

Since, in the fifth embodiment, the lead-inserting element 14 is removed from the control circuit substrate 30, the soldering process for the substrate 30 is simplified. Since the element 14 is mounted on the flexible printed-circuit-sheet 4 at a position between connecting pins 36, the space on the flexible sheet 4 is effectively utilized A sixth embodiment of the present invention will be described with reference to FIGS. 8A and 8B. In this embodiment, the lead-inserting element 14 mounted on the flexible printed-circuit-sheet 4 is suported by a holder portion 32d integrally formed with the connector 32. Other structures are the same as those of the fifth embodiment. The holder portion 32d is made of the same resin material as the connector 32 and is shaped in a cylinder which holds the outer periphery of the element 14.

Figure 8A:
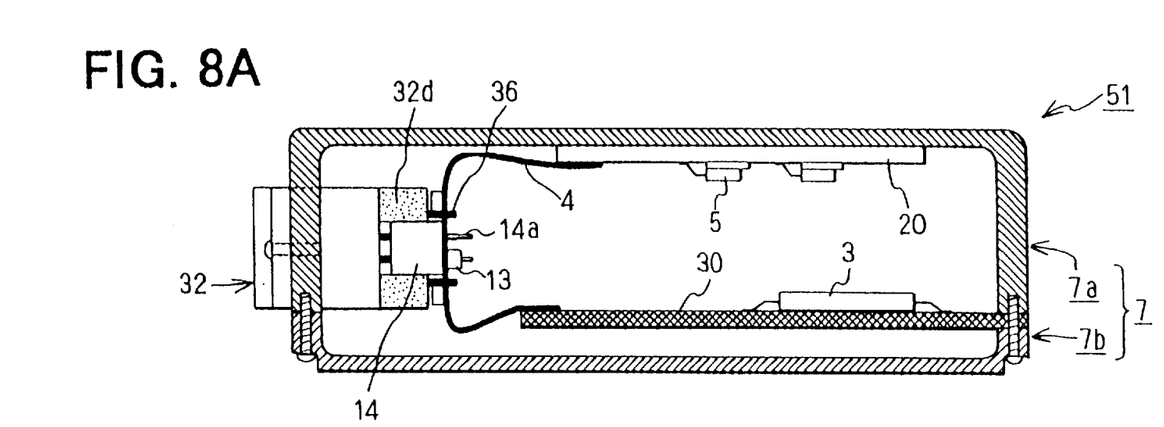
FIG. 8A is a cross-sectional view showing an electronic control unit as a sixth embodiment of the present invention.
Figure 8B:
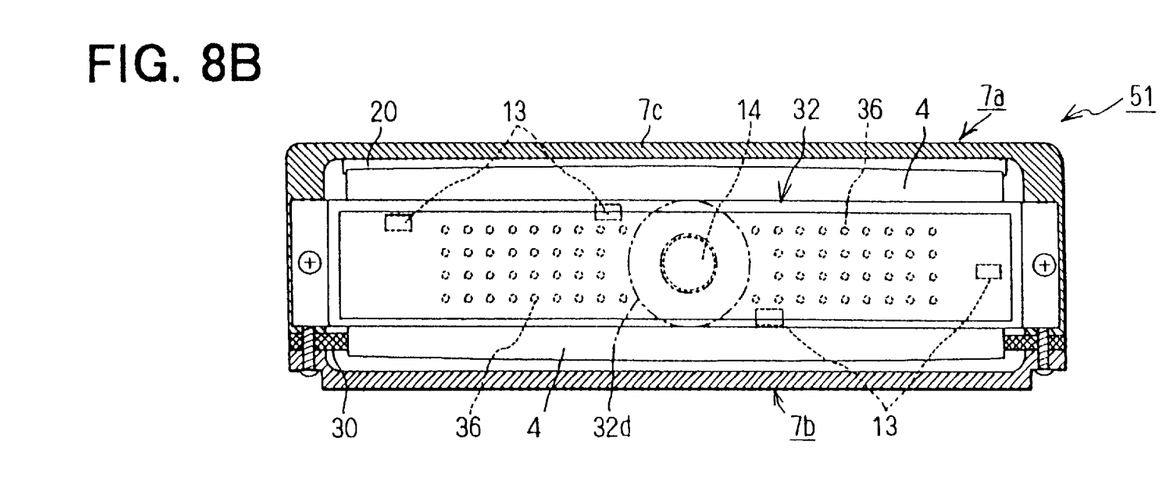
FIG. 8B is a cross-sectional view showing the electronic control unit shown in FIG. SA, viewed from a connector side.

There is a possibility that the electrical connection of the lead-inserting element 14 carried by the flexible sheet 4 would be loosened if the casing 7 is excessively vibrated. For avoiding such a possibility, the holding portion 32d is formed to support the lead-inserting element 14 connected to the flexible printed-circuit-sheet 4.

Figure 9A:
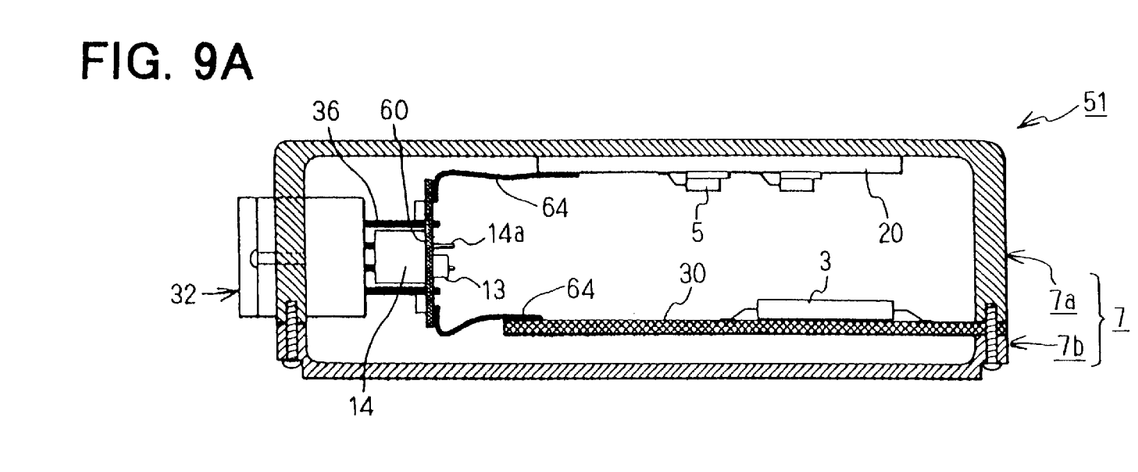
FIG. 9A is a cross-sectional view showing an electronic control unit as a seventh embodiment of the present invention.
Figure 9B:
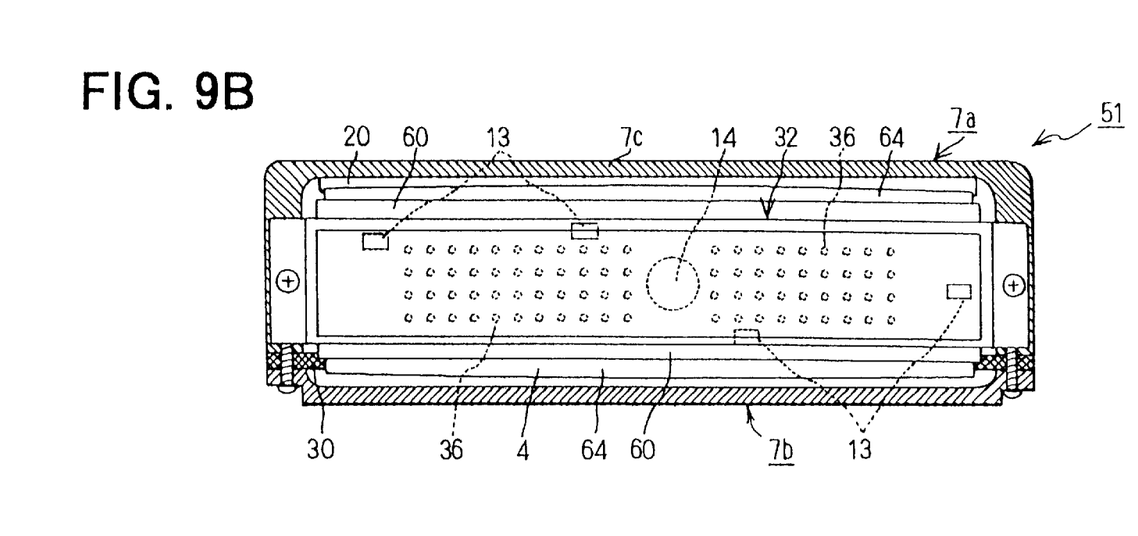
FIG. 9B is a cross-sectional view showing the electronic control unit shown in FIG. 9A, viewed from a connector side.

A seventh embodiment of the present invention will be described with reference to FIGS. 9A and 9B. In this embodiment, the flexible printed-circuit-sheet 4 used in the foregoing embodiments is divided into two portions, a hard printed-board 60 and flexible printed-sheets 64. The mounting portion for mounting components including the noise-absorbing elements 13 and the lead-inserting element 14 is replaced with the hard printed-board 60. The connecting portions for connecting the flexible printed-circuit-sheet 4 to both substrates 20, 30 are replaced with the flexible printed-sheets 64. Other structures are the same as those of the fifth embodiment.

The hard printed-board 60 is made of a hard resin material such as glass-epoxy and is shaped into a rectangular shape. The hard printed-board 60 is mechanically supported by the connector pins 36 soldered thereon. The flexible printed-sheets 64 made of a flexible resin material electrically connect the hard printed-board 60 to both substrates 20, 30.

Since, in this embodiment, the components such as the noise-absorbing elements 13 and the lead-inserting element 14 are mounted on and electrically connected to the hard printed-board 60, the electrical connections of those components are more stable against vibration.

Figure 10:
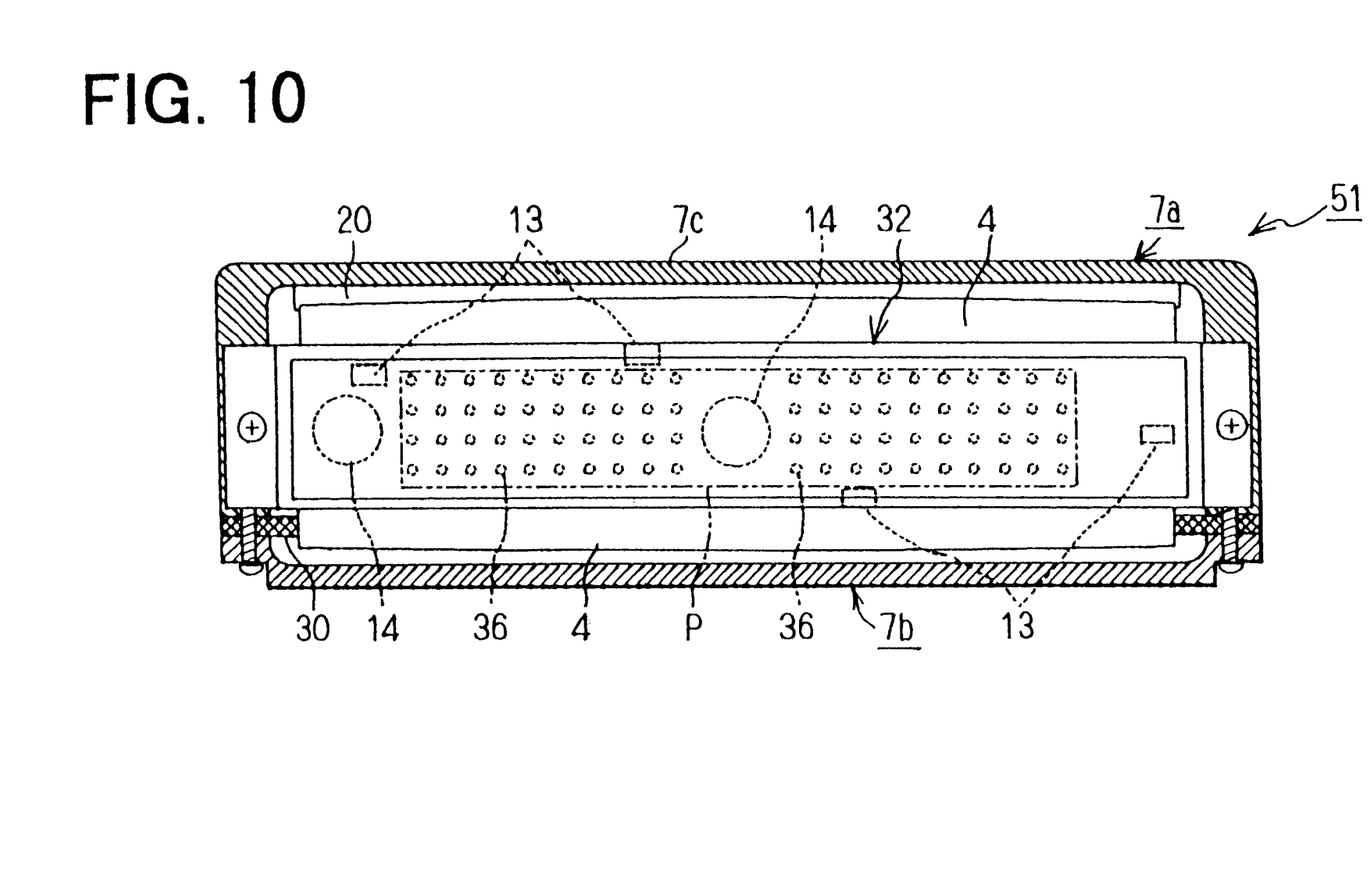
FIG. 10 is a cross-sectional view showing an example of modified forms of the embodiments shown above.

The present invention is not limited to the foregoing embodiments, but those embodiments may be variously modified. For example, as shown in FIG. 10, the lead-inserting element 14 which is mounted in the center portion of the flexible printed-circuit-sheet 4 in the fourth embodiment may be moved to an outside of the area P where the connector pins 36 are connected. Alternatively, those components such as the noise-absorbing elements 13 and the lead-inserting element 14 may be placed both in the area P and the outside thereof. Though the electronic control unit according to the present invention is explained to be used in the automobile engine control, it may be used for other purposes.

While the present invention has been shown and described with reference to the foregoing preferred embodiments, it will be apparent to those skilled in the art that changes in form and detail may be made therein without departing from the scope of the invention as defined in the appended claims.

What is claimed is:

1. An electronic control unit comprising:

a casing including a heat dissipation plate;

a driving circuit substrate having driving elements mounted thereon for supplying electric power in a controlled manner to actuators connected to the electronic control unit, the driving circuit substrate being mounted on the heat dissipation plate;

a control circuit substrate having control elements mounted thereon for controlling operation of the driving elements based on signals fed from sensors connected to the electronic control unit, the control circuit substrate being contained in the casing apart from the driving circuit substrate with a separating space;

a connector for electrically connecting the actuators and sensors to the electronic control unit, the connector being mounted on and electrically connected to the control circuit substrate, at least a part of the connector being disposed in the separating space; and a flexible printed-circuit-sheet for electrically connecting the driving circuit substrate and the control circuit substrate, one end of the flexible printed-circuit-sheet connected to the control circuit substrate being positioned in a vicinity of the connector.

2. The electronic control unit as in claim 1, wherein:

the separating space is formed between the driving circuit substrate and the control circuit substrate disposed in parallel to each other, and the connector is positioned as a whole within the separating space.

3. The electronic control unit of claim 1, wherein:

the connector is mounted on, and electrically connected to the control circuit substrate by a plurality of connector pins; and the flexible printed-circuit-sheet is electrically connected to the driving circuit substrate at one end thereof and to the control circuit substrate at the other end, the other end being positioned at a vicinity of the connector pins connected to the control circuit substrate.

4. The electronic control unit of claim 1, wherein:

the flexible printed-circuit-sheet is electrically connected to the driving circuit substrate at one end thereof and to the control circuit substrate at the other end; and the connector is supported by the casing and electrically connected to the flexible printed-circuit-sheet at a position between both ends of the flexible printed-circuit-sheet.

5. An electronic control unit comprising:

a casing including a heat dissipation plate;

a driving circuit substrate having driving elements mounted thereon for supplying electric power in a controlled manner to actuators connected to the electronic control unit, the driving circuit substrate being mounted on the heat dissipation plate;

a control circuit substrate having control elements mounted thereon for controlling operation of the driving elements based on signals fed from sensors connected to the electronic control unit, the control circuit substrate being contained in the casing apart from the driving circuit substrate with a separating space;

a flexible printed-circuit-sheet for electrically connecting the driving circuit substrate and the control circuit substrate, the flexible printed-circuit-sheet comprising a hard printed-board and a pair of flexible printed-sheets, each connected to one of the sides of the hard printed-board;

a connector for electrically connecting the actuators and sensors to the electronic control unit, the connector being mounted on and electrically connected to the hard printed-board; and a noise-absorbing element for absorbing external noises entering into the electronic control unit, and that is mounted on and electrically connected to the hard printed-board in a vicinity of the connector.

6. The electronic control unit of claim 5, wherein:

the connector comprises a plurality of connector pins, the connector further being mounted and electrically connected to the flexible printed-circuit-sheet by the plurality of connector pins; and the noise-absorbing element is mounted on and electrically connected to the connector.

7. The electronic control unit of claim 5, wherein:

a lead-inserting element is inserted into the hard printed-board and electrically connected thereto.

8. The electronic control unit of claim 5, wherein:

the connector includes a holder portion that mechanically supports electrical components mounted on the flexible printed-circuit sheet.

9. The electronic control unit of claim 5, wherein:

the connector is electrically connected to the hard printed-board by a plurality of connector pins, and electrical components, including the noise-absorbing element and a lead inserting element, are mounted on the hard printed-board at positions outside an area where the connector pins are located.

10. A method of manufacturing an electronic control unit comprising:

providing a casing with a heat dissipation plate;

mounting a driving circuit substrate on which heat generating driving elements are mounted on the heat dissipation plate;

providing a control circuit substrate on which heat sensitive elements are mounted in the casing so that the control circuit substrate is spaced apart from the driving circuit substrate with a separating space;

providing a flexible printed-circuit-sheet in the casing, the flexible printed-circuit-sheet including a hard printed-board and a pair of flexible printed-sheets, each connected to different sides of the hard printed-board;

mounting a connector on the casing and electrically connecting the connector to the hard printed-board; and electrically connecting a first of the pair of flexible printed-sheets to the driving circuit substrate and a second of the pair of flexible printed-sheets to the control circuit substrate.

11. The method of manufacturing an electronic control unit of claim 10, further comprising:

inserting and soldering a plurality of connector pins onto the hard-printed board;

electrically connecting the connector to the hard-printed board through the plurality of connector pins; and surface mounting a noise absorbing element onto the hard printed-board.

* * * * *